United States Patent
Yang et al.

(10) Patent No.: US 8,530,873 B2
(45) Date of Patent: Sep. 10, 2013

(54) ELECTROFORMING FREE MEMRISTOR AND METHOD FOR FABRICATING THEREOF

(75) Inventors: Jianhua Yang, Palo Alto, CA (US); Gilberto Medeiros Ribeiro, Palo Alto, CA (US); R Stanley Williams, Portols Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/383,994

(22) PCT Filed: Jan. 29, 2010

(86) PCT No.: PCT/US2010/022649
§ 371 (c)(1),
(2), (4) Date: Jan. 13, 2012

(87) PCT Pub. No.: WO2011/093894
PCT Pub. Date: Aug. 4, 2011

(65) Prior Publication Data
US 2012/0280196 A1    Nov. 8, 2012

(51) Int. Cl.
*H01L 29/00* (2006.01)

(52) U.S. Cl.
USPC .............. 257/1; 257/2; 257/3; 257/4; 257/5; 257/E45.002; 257/E45.003

(58) Field of Classification Search
USPC ....... 257/1, 2, 3, 4, 5, 537, E45.002, E45.003
See application file for complete search history.

(56) References Cited

U.S. PATENT DOCUMENTS

| | | | |
|---|---|---|---|
| 8,207,593 B2 * | 6/2012 | Bratkovski et al. | ........... 257/537 |
| 2008/0001172 A1 | 1/2008 | Karg et al. | |
| 2008/0165569 A1 | 7/2008 | Chen et al. | |
| 2009/0317958 A1 | 12/2009 | Tang et al. | |

FOREIGN PATENT DOCUMENTS

JP       2008-244090       10/2008

* cited by examiner

*Primary Examiner* — Andy Huynh

(57) ABSTRACT

An electroforming free memristor includes a first electrode, a second electrode spaced from the first electrode, and a switching layer positioned between the first electrode and the second electrode. The switching layer is formed of a matrix of a switching material and reactive particles that are to react with the switching material during a fabrication process of the memristor to form one or more conductance channels in the switching layer.

15 Claims, 3 Drawing Sheets

ELECTROFORMING FREE MEMRISTOR AND METHOD FOR FABRICATING THEREOF

GOVERNMENT LICENSE RIGHTS

This invention was made in the course of research partially supported by grants from the U.S. Government. The U.S. Government has certain rights in the invention.

CLAIM FOR PRIORITY

The present application is a national stage filing under 35 U.S.C. 371 of PCT application number PCT/US2010/22649, having an international filing date of Jan. 29, 2010, which is incorporated by reference in its entirety.

BACKGROUND

Memristor switch devices, which are often formed of nanoscale metal/titanium oxide/metal layers, employ an "electroforming" process to enable resistive switching. The "electroforming" process involves a one-time application of a relatively high voltage or current that produces a significant change of electronic conductivity through the titanium oxide layer. The electrical switching arises from the coupled motion of electrons and ions within the oxide material. During the electroforming process, oxygen vacancies are created and drift towards the cathode, forming localized conducting channels in the oxide. Simultaneously, $O^{2-}$ ions drift towards the anode where they evolve $O_2$ gas, causing physical deformation of the junction. The gas eruption often results in physical deformation of the oxide, such as, bubbles, near the locations where the conducting channels form. In addition, the conducting channels formed through the electroforming process often have a wide variance of properties depending upon how the electroforming process occurred. This variance of properties has relatively limited the adoption of metal oxide switches in computing devices.

BRIEF DESCRIPTION OF THE DRAWINGS

Embodiments are illustrated by way of example and not limited in the following figure(s), in which like numerals indicate like elements, in which.

DETAILED DESCRIPTION

Figure 1:
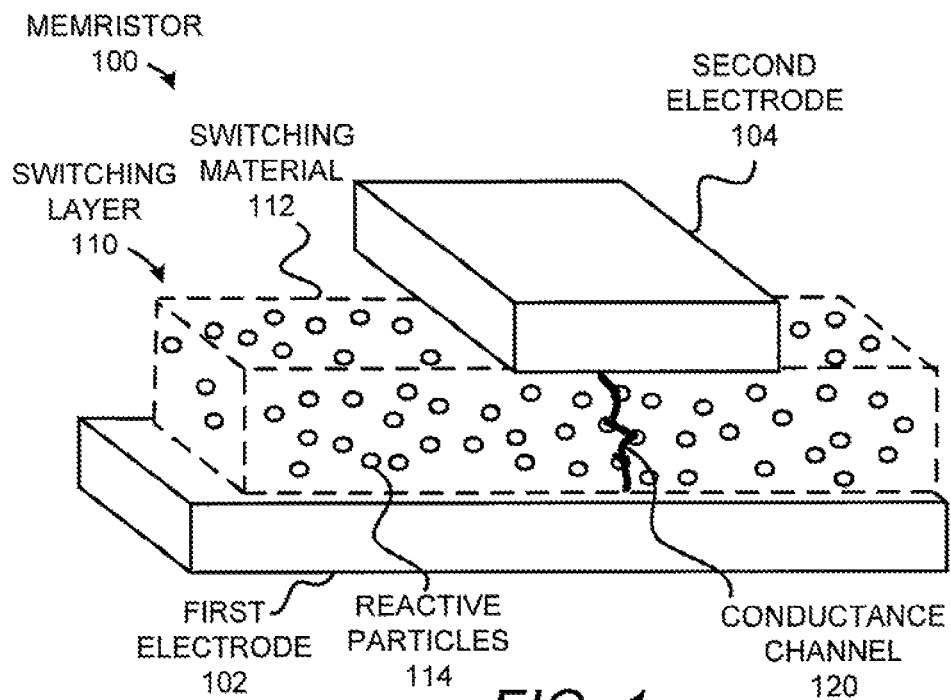
FIG. 1 illustrates a perspective view of an electrically actuated apparatus or memristor, according to an embodiment of the invention.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures are not described in detail so as not to unnecessarily obscure the description of the embodiments.

Disclosed herein is an electrically actuated apparatus, which is equivalently recited herein as a memristor, formed of a pair of spaced apart electrodes with a switching material positioned between the electrodes. It should thus be understood that the terms "electrically actuated device" and "memristor" are used interchangeably throughout the present disclosure. In any regard, the switching material is formed of a matrix of a switching material and reactive particles configured to react with the switching material during a fabrication process of the electrically actuated apparatus to form a conductance channel in the switching layer as discussed in greater detail herein below.

In one regard, therefore, the conductance channel is formed in the switching layer without requiring that an electroforming process be performed on the electrically actuated apparatus, and as such, the memristor comprises an electroforming free memristor. The electrically actuated apparatus disclosed herein thus does not suffer from some of the drawbacks associated with conventional apparatuses that require an electroforming process to generate conductance channels. In addition, the electrically actuated apparatus disclosed herein requires a relatively low power to operate because the relatively high voltage or current required to generate the conductance channel required with conventional apparatuses is not required. Moreover, because the conductance channel of the electrically actuated apparatus disclosed herein is formed during the fabrication process, the conductance channel may be formed with a relatively greater level of control as compared with conventional apparatuses that employ electroforming operations to form conductance channels.

The electrically actuated apparatus discussed herein may be implemented in a cross-bar array formed of a plurality of the electrically actuated apparatuses. In one respect, conductance channels in the plurality of electrically actuated apparatuses may be formed concurrently with each other through the fabrication process discussed herein. As such, the conductance channels may be formed in a relatively simpler and faster manner than is possible with conventional fabrication techniques, which require the application of a relatively high voltage or current through each of the apparatuses to form the conductance channels. In addition, because the conductance channels are produced under the exact same conditions for all of the apparatuses in the cross-bar array through implementation of the fabrication process disclosed herein, there is a lower level of variance in the formation of the conductance channels as compared with conventional fabrication techniques. As such, the distributions of on-off resistances through the conductance channels and the operation parameters are significantly smaller than cross-bar arrays formed through conventional fabrication techniques.

The term "singly configurable" means that a switch is able to change its state only once via an irreversible process such as an oxidation or reduction reaction; such a switch may be the basis of a programmable read only memory (PROM), for example.

The term "reconfigurable" means that a switch can change its state multiple times via a reversible process such as an oxidation or reduction; in other words, the switch may be opened and closed multiple times such as the memory bits in a random access memory (RAM).

The term "configurable" means either "singly configurable" or "reconfigurable".

Micron-scale dimensions refer to dimensions that range from 1 micrometer to a few micrometers in size.

Sub-micron scale dimensions refer to dimensions that range from 0.1 nanometers to 5 nanometers (0.005 micrometers).

Micron-scale and submicron-scale wires refer to rod or ribbon-shaped conductors or semiconductors with widths or diameters having the dimensions of 0.04 to 10 micrometers, heights that can range from a few nanometers to a micrometer, and lengths of several micrometers and longer.

A memristor is a two-terminal device in which the magnetic flux between the terminals is a function of the amount of electric charge that has passed through the device.

A crossbar is an array of electrically actuated apparatuses, for instance, memristors, that can connect each wire in one set of parallel wires to every member of a second set of parallel wires that intersects the first set (usually the two sets of wires are perpendicular to each other, but this is not a necessary condition).

As used herein, the functional dimension of the device is measured in nanometers (typically less than 50 nm), but the lateral dimensions may be nanometers, sub-microns or microns.

With reference first to FIG. 1, there is shown a perspective view of an electrically actuated apparatus 100, such as a memristor, according to an embodiment. It should be understood that the electrically actuated apparatus 100 depicted in FIG. 1 may include additional components and that some of the components described herein may be removed and/or modified without departing from a scope of the electrically actuated apparatus 100. It should also be understood that the components depicted in FIG. 1 are not drawn to scale and thus, the components may have different relative sizes with respect to each other than as shown therein.

Generally speaking, the electrically actuated apparatus 100 depicted in FIG. 1 may be built at the micro- or nano-scale and used as a component in a wide variety of electronic circuits. For instance, the electrically actuated apparatus 100 may be used as the basis for memories, switches, and logic circuits and functions. When used as a basis for memories, the electrically actuated apparatus 100 may be used to store a bit of information, 1 or 0. When used as a switch, the electrically actuated apparatus 100 may either be a closed or open switch in a cross-point memory. When used as a logic circuit, the electrically actuated apparatuses 100 may be employed as bits in a logic circuit that resembles a Field Programmable Gate Array, or as the basis for a wired-logic Programmable Logic Array. The electrically actuated apparatus 100 disclosed herein is also configured to find uses in a wide variety of other applications.

As depicted in FIG. 1, the electrically actuated apparatus 100 includes a first electrode 102 positioned below a second electrode 104. In addition, the first electrode 102 is in a crossed arrangement with respect to the second electrode 104, such that the first electrode 102 is arranged substantially perpendicularly to the second electrode 104. One or both of the first electrode 102 and the second electrode 104 may be formed of metal or semiconductor materials. By way of particular example, both of the first electrode 102 and the second electrode 104 are formed of, for instance, platinum, tungsten, gold, titanium, silver, titanium nitride, tungsten nitride or the like. As another particular example, both the first electrode 102 and the second electrode 104 are formed of doped silicon.

The electrically actuated apparatus 100 also includes a switching layer 110 disposed between the first electrode 102 and the second electrode 104. The switching layer 110 has been shown with dashed lines to indicate that the switching layer 110 may be relatively larger than the first electrode 102 and the second electrode 104. In other embodiments, the switching layer 110 may be relatively smaller than the first electrode 102 and the second electrode 104. In any regard, the switching layer 110 is depicted as being formed of a matrix of a switching material 112 and reactive particles 114. The switching material 112 may include, for instance, titanium dioxide ($TiO_2$) or other oxide species, such as nickel oxide, zinc oxide, hafnium oxide, zirconium oxide, etc. The switching material 112 may also be formed of ternary or quaternary oxides, or other complex oxides, such as, STO, PCMO, etc. The switching material 112 may further be formed of nitrides and/or sulfides.

The reactive particles 114 may comprise any suitable material configured to react with the switching material 112 during an annealing operation or other thermal forming operation, such as, heating. More particularly, for instance, the reactive particles 114 may be selected to react with the switching material 112 to take oxygen atoms from the switching material 112 during the annealing or thermal forming operation. The reactive particles 114 interspersed with the switching material 112 may thus be selected based upon how the material interacts with the materials forming the switching material 112. Examples of suitable materials for the metal particles 114 may include, Al, Zr, Hf, Ta, Si, etc. In addition, the amount and the size of the reactive particles 114 may be varied to control the formation of conductance channels in the switching material 112.

In one example, the reactive particles 114 comprise materials for which the absolute value of the Gibbs formation energy value is significantly larger than the absolute value of the Gibbs formation energy value of the switching material 112. In this example, Ellingham diagrams may be employed in identifying the Gibbs formation energy values of the materials and to guide selection of the materials for the switching layer 110. For instance, the data contained in the Ellingham diagrams may be employed to determine the oxide formation abilities of the materials to be used in the switching layer 110. More particularly, the Ellingham diagrams may be employed to determine which reactive material 114 has a sufficiently high oxide formation ability with respect to a particular switching material 112.

As also shown in FIG. 1, a conductance channel 120 is configured to be formed in the switching layer 110 at a junction between the first electrode 102 and the second electrode 104. The conductance channel 120 is configured to be formed through a localized atomic modification in the switching layer 112 caused by the annealing or other thermal forming process. By way of particular example in which the switching material 112 comprises $TiO_2$ and the reactive particles 114 comprise Al, during the thermal forming process, the Al will take Oxygen from the $TiO_2$ locally. The $TiO_2$ will thus be reduced to $TiO_{2-x}$. In addition, one or more conductance channels 120 are configured to form in the areas containing the reduced $TiO_{2-x}$ and these conductance channel(s) 120 are responsible for the subsequent switching in the memristor 100. During the switching operation, the oxygen atoms are configured to move in an electric field conducted through the conductance channel(s) 120 to open or close a gap inside the conductance channel(s) 120, which may be read to determine whether the electrically actuated apparatus 100 is in an on or off state.

The conductance channel(s) 120 are referred to herein as the active region of the electrically actuated apparatus 100. In one regard, the conductivity of the conductance channel(s) 120 may be modulated by applying different biases across the first electrode 102 and the second electrode 104. Thus, the electrically actuated apparatus 100 may be reconfigurable based upon the bias applied across the first electrode 102 and the second electrode 104. In other instances, however, the switching layer 110 is formed to be singly configurable.

Figure 2:
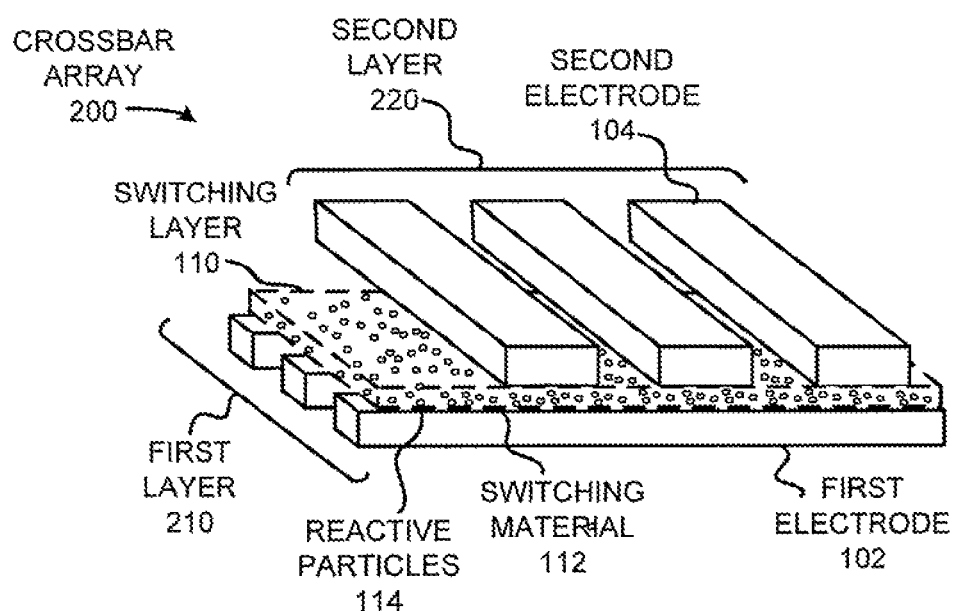
FIG. 2 illustrates a perspective view of a crossbar array employing a plurality of the electrically actuated apparatuses or memristors depicted in FIG. 1, according to an embodiment of the invention.

With reference now to FIG. 2, there is shown a perspective view of a crossbar array 200 employing a plurality of the electrically actuated apparatuses or memristors 100 shown in FIG. 1, according to an embodiment. It should be understood that the crossbar array 200 depicted in FIG. 2 may include additional components and that some of the components described herein may be removed and/or modified without departing from a scope of the crossbar array 200.

As shown in FIG. 2, a first layer 210 of approximately parallel first electrodes 102 is overlain by a second layer 220 of approximately parallel second electrodes 104. The second electrodes 104 of the second layer 220 are roughly perpendicular, in orientation, to the first electrodes 102 of the first layer 210, although the orientation angle between the layers may vary. The two layers 210 and 220 form a lattice, or crossbar, with each second electrode 104 of the second layer 220 overlying all of the first electrodes 102 of the first layer 210 and coming into close contact with each first electrode 102 of the first layer 210 at respective junctions, which represent the closest contact between two of the first and second electrodes 102 and 104. The crossbar array 200 may be fabricated from micron-, submicron or nanoscale-electrodes 102, 104, depending on the application.

As also shown in FIG. 2, the switching layer 110 extends between the first layer 210 and the second layer 220. As discussed in greater detail herein below, respective conductance channels 120 (not shown) are formed in multiple ones of the electrically actuated apparatuses 100 concurrently during the thermal forming process.

Although the first electrode 102 and the second electrode 104 have been depicted has having rectangular cross-sections in FIGS. 1 and 2, it should be understood that the first electrode 102 and/or the second electrode 104 may have other cross-sectional shapes, such as, circular, oval, hexagonal, triangular, trapezoidal, etc.

Figure 3:
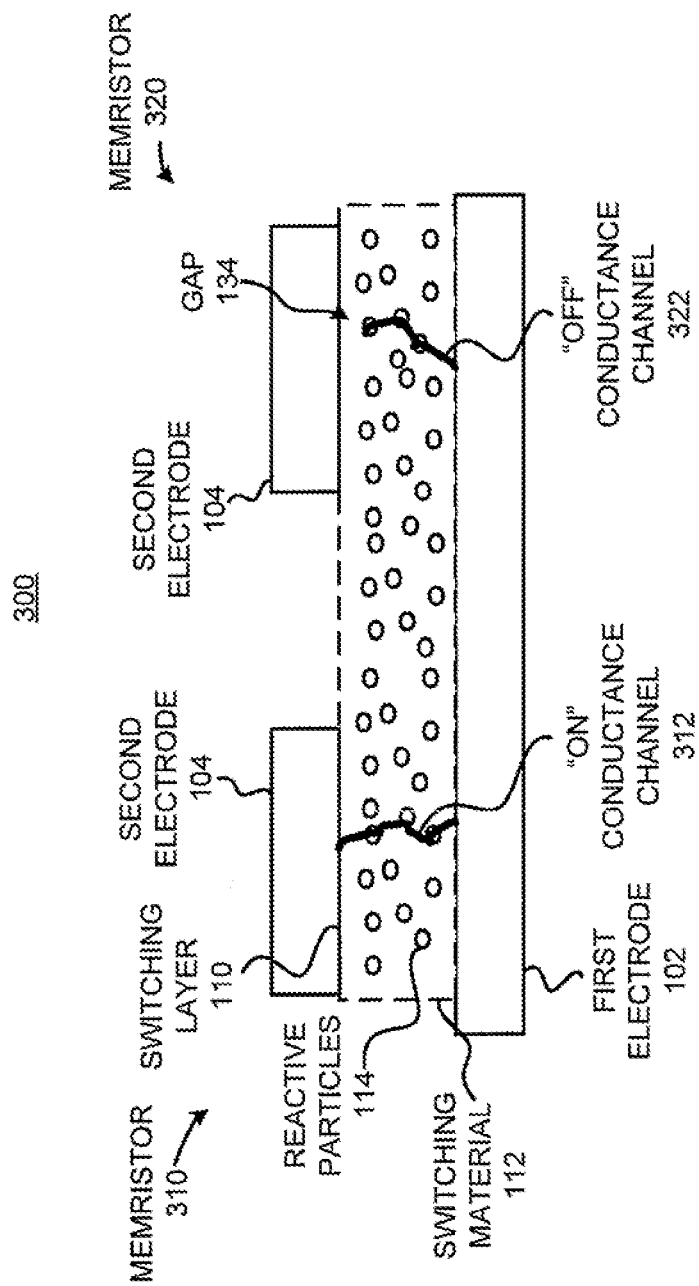
FIG. 3 illustrates a cross-sectional side view of a pair of electrically actuated apparatuses or memristors, according to an embodiment of the invention.

Turning now to FIG. 3, there is shown a cross-sectional side view 300 of a pair of electrically actuated apparatuses 310 and 320, according to an example. As shown therein, a first electrically actuated apparatus 310 is depicted as having an "on" conductance channel 312 formed in the junction between the first electrode 102 and the second electrode 104. The conductance channel 312 is construed as being "on" because the conductance channel 312 extends from the first electrode 102 to the second electrode 104 and thus, there is a relatively low resistance to electrical energy supplied between the first electrode 102 and the second electrode 104 of the first electrically actuated apparatus 310.

As also shown in FIG. 3, a second electrically actuated apparatus 320 is depicted as having an "off" conductance channel 322 formed in the junction between the first electrode 102 and a second electrode 104 of the second electrically actuated apparatus 320. The conductance channel 322 is construed as being "off" because the conductance channel 322 does not extend from the first electrode 102 to the second electrode 104. Instead, a gap 134 exists in the conductance channel 322 and thus, there is a relatively higher resistance to electrical energy supplied between the first electrode 102 and the second electrode 104 of the second electrically actuated apparatus 320.

Figure 4:
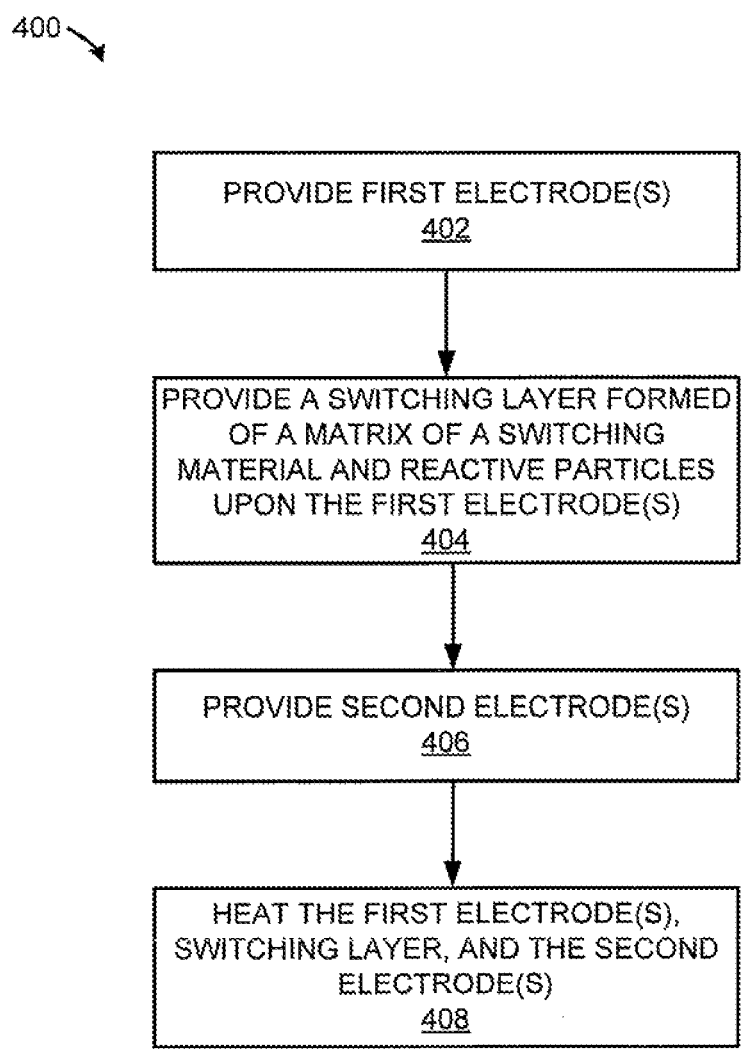
FIG. 4 illustrates a flow diagram of a method for fabricating an electrically actuated apparatus or memristor, according to an embodiment of the invention.

Turning now to FIG. 4, there is shown a flow diagram of a method 400 for fabricating an electrically actuated apparatus or memristor 100, according to an embodiment. It should be understood that the method 400 depicted in FIG. 4 may include additional steps and that some of the steps described herein may be removed and/or modified without departing from a scope of the method 400.

At step 402, one or more first electrodes 102 are provided. The first electrode(s) 102 may be provided through any suitable formation process, such as, chemical vapor deposition, sputtering, etching, lithography, etc. In addition, when the method 400 is implemented to form a cross-bar array 200, a plurality of first electrodes 102 may be provided as a first layer 210 of first electrodes 102, for instance, as depicted in FIG. 2.

At step 404, a switching layer 110 formed of a matrix of a switching material 112 and reactive particles 114 is provided upon the first electrode(s) 102. According to an example, the switching material 112 and the reactive particles 114 are co-deposited, such as, through sputtering, pulse laser deposition, atomic layer deposition, etc., to form the switching layer 110. According to another example, the reactive particles 114 are interspersed into the switching material 112 prior to deposition of the matrix of materials on the first electrode(s) 102. According to a further example, the switching material 112 is grown on the electrode(s) 102 and the reactive particles 114 are deposited on the switching material 112 during the growth process. In this example, the switching material 112 may be grown through use of, for instance, metal-catalyzed growth from vapor, liquid, or solid-phase precursors, growth from a chemical solution, spin coating or rapid deposition of material vaporized from a solid source.

In any regard, the amount of reactive particles 114 interspersed with the switching material 112 may be varied to control the formation of the conductance channel(s) 120.

Following step 404, a top surface of the switching layer 110 may be planarized, for instance, by chemical-mechanical polishing, to create a relative smooth surface.

At step 406, one or more second electrodes 104 are formed on the switching layer 110. The one or more second electrodes 104 may be provided through a formation process, such as E-beam evaporation, chemical vapor deposition, sputtering, atomic layer deposition, etching, (imprint) lithography, etc.

At step 408, a heating operation or other thermal forming operation, such as an annealing operation, is performed on the first electrode(s) 102, the switching layer 110, and the second electrodes (104) to cause one or more conductance channels 120 to form in one or more junctions of the first electrode(s) 102 and second electrode(s) 104. As discussed above, the application of heat to the switching layer 110 causes a chemical reaction to occur between the switching material 112 and the reactive particles 114, which results in the formation of conductance channel(s) 120 in the switching layer 110. More particularly, the reactive particles 114 are oxidized and the switching material 112 is reduced during the annealing operation, which results in the formation of the conductance channels(s) 120.

One or more parameters of the heating operation may be varied to control formation of the conductance channels 120 in the switching layer 110. The parameters include, for instance, temperature, duration, rate of annealing, environmental conditions, etc. According to an embodiment, the parameters are controlled to cause the conductance channels 120 to have relatively small diameters, for instance, on the order of a few nanometers. By way of particular example, the conductance channels 120 may be controlled to have diameters within the range of about 0.5 to about 50 nm.

Although step 408 has been described as being performed after the second electrode(s) 104 have been provided, it should be understood that the annealing operation may be performed prior the second electrode(s) 104 being provided.

Through implementation of the method 400, conductance channels 120 may be formed in the switching layer 110 between one or more memristors 100 without requiring that an electroforming operation be implemented to form the conductance channels 120. In instances where the method 400 is employed to form the conductance channels 120 in multiple memristors 100, the method 400 may also be implemented to concurrently form the conductance channels 120 in the memristors 100.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. An electroforming free memristor comprising:
   a first electrode;
   a second electrode spaced from the first electrode; and
   a switching layer positioned between the first electrode and the second electrode, said switching layer formed of a matrix of a switching material and reactive particles that are to react with the switching material during a fabrication process of the memristor to form one or more conductance channels the switching layer.

2. The electroforming free memristor according to claim 1, wherein the fabrication process of the memristor comprises performance of a thermal forming operation, and wherein the one or more conductance channels are to be formed during performance of the thermal forming operation.

3. The electroforming free memristor according to claim 2, wherein the switching material comprises a material that is to be reduced and the reactive particles comprise a material that is to become oxidized during performance of the thermal forming operation.

4. The electroforming free memristor according to claim 1, wherein the reactive particles comprise a material having an absolute value of a Gibbs formation energy value that is significantly higher than an absolute value of a Gibbs formation energy value of the switching material.

5. The electroforming free memristor according to claim 1, wherein the reactive particles comprise metal particles.

6. The electroforming free memristor according to claim 1, wherein formation of the one or more conductance channels occurs in the switching layer without performance of an electroforming operation.

7. A crossbar array composed of a plurality of the electroforming free memristors of claim 1.

8. A method for fabricating an electroforming free memristor, said method comprising:
   providing a first electrode;
   providing a switching, layer upon the first electrode, wherein the switching layer is formed of a matrix of a switching material and reactive particles that are to react with the switching material during a fabrication process of the memristor to form one or more conductance channels in the switching layer;
   providing a second electrode upon said switching layer; and
   heating the first electrode, the switching layer and the second electrode to form the one or more conductance channels in the switching layer.

9. The method according to claim 8, wherein providing the switching layer further comprises co-depositing the switching material and the reactive particles on the first electrode.

10. The method according to claim 8, wherein heating further comprises controlling at least one parameter during the heating to variably control formation of the one or more conductance channels in the switching layer.

11. The method according to claim 8, wherein the switching material comprises a material that is to be reduced and the reactive particles comprise a material that is to become oxidized during performance of the thermal forming operation.

12. A method for fabricating an electroforming free memristor, said method comprising:
    providing a first electrode;
    providing a switching layer upon the first electrode, wherein the switching layer is formed of a matrix of a switching material and reactive particles that are to react with the switching material during a fabrication process of the memristor to form one or more conductance channels in the switching layer;
    heating the first electrode and the switching layer to form the one or more conductance channels in the switching layer; and
    providing the second electrode upon said switching layer.

13. The method according to claim 12, further comprising:
    planarizing a top surface of the switching layer; and
    wherein providing the second electrode upon said switching layer further comprises providing the second electrode upon the planarized top surface of the switching layer.

14. The method according to claim 12, wherein the switching material comprises a material that is to be reduced and the reactive particles comprise a material that is to become oxidized during performance of the thermal forming operation.

15. The method according to claim 12, wherein heating further comprises controlling at least one parameter during the heating to variably control formation of the one or more conductance channels in the switching layer.

* * * * *

UNITED STATES PATENT AND TRADEMARK OFFICE
CERTIFICATE OF CORRECTION

PATENT NO. : 8,530,873 B2  Page 1 of 1
APPLICATION NO. : 13/383994
DATED : September 10, 2013
INVENTOR(S) : Jianhua Yang et al.

It is certified that error appears in the above-identified patent and that said Letters Patent is hereby corrected as shown below:

In the Claims

In column 7, line 30, in Claim 1, delete "the" and insert -- in the --, therefor.

In column 8, line 4, in Claim 8, delete "switching," and insert -- switching --, therefor.

Signed and Sealed this
Thirty-first Day of December, 2013

Margaret A. Focarino
*Commissioner for Patents of the United States Patent and Trademark Office*